United States Patent
Huang et al.

(10) Patent No.: US 12,446,305 B2
(45) Date of Patent: *Oct. 14, 2025

(54) UNIFORM GATE WIDTH FOR NANOSTRUCTURE DEVICES

(71) Applicant: Taiwan Semiconductor Manufacturing Co., Ltd., Hsin-Chu (TW)

(72) Inventors: Jui-Chien Huang, Hsinchu (TW); Shih-Cheng Chen, New Taipei (TW); Chih-Hao Wang, Hsinchu County (TW); Kuo-Cheng Chiang, Hsinchu County (TW); Zhi-Chang Lin, Hsinchu County (TW); Jung-Hung Chang, Hsinchu (TW); Lo-Heng Chang, Hsinchu (TW); Shi Ning Ju, Hsinchu (TW); Guan-Lin Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/522,687

(22) Filed: Nov. 29, 2023

(65) Prior Publication Data

US 2024/0096895 A1 Mar. 21, 2024

Related U.S. Application Data

(63) Continuation of application No. 17/728,247, filed on Apr. 25, 2022, now Pat. No. 11,855,096, which is a (Continued)

(51) Int. Cl.
*H01L 27/092* (2006.01)
*H01L 29/06* (2006.01)
(Continued)

(52) U.S. Cl.
CPC ....... *H10D 84/853* (2025.01); *H10D 30/0245* (2025.01); *H10D 30/6211* (2025.01);
(Continued)

(58) Field of Classification Search
CPC ......... H01L 21/02603; H01L 21/28141; H01L 21/823412; H01L 21/823431; H01L 21/823821; H01L 21/845; H01L 27/0886; H01L 27/0924; H01L 27/1211; H01L 29/0653; H01L 29/0665; H01L 29/0669; H01L 29/0673; H01L 29/41791;
(Continued)

(56) References Cited

U.S. PATENT DOCUMENTS 8,796,666 B1 8/2014 Huang et al.
8,815,712 B2 8/2014 Wan et al.
(Continued)

*Primary Examiner* — David C Spalla
(74) *Attorney, Agent, or Firm* — HAYNES AND BOONE, LLP

(57) ABSTRACT

According to one example, a semiconductor device includes a substrate and a fin stack that includes a plurality of nanostructures, a gate device surrounding each of the nanostructures, and inner spacers along the gate device and between the nanostructures. A width of the inner spacers differs between different layers of the fin stack.

20 Claims, 13 Drawing Sheets

Related U.S. Application Data continuation of application No. 16/932,476, filed on Jul. 17, 2020, now Pat. No. 11,315,925.

(60) Provisional application No. 62/894,325, filed on Aug. 30, 2019, provisional application No. 62/892,661, filed on Aug. 28, 2019.

(51) Int. Cl.
  *H10D 30/01* (2025.01)
  *H10D 30/62* (2025.01)
  *H10D 62/10* (2025.01)
  *H10D 64/01* (2025.01)
  *H10D 84/01* (2025.01)
  *H10D 84/03* (2025.01)
  *H10D 84/85* (2025.01)

(52) U.S. Cl.
  CPC ......... *H10D 62/118* (2025.01); *H10D 64/021* (2025.01); *H10D 84/0128* (2025.01); *H10D 84/0158* (2025.01); *H10D 84/038* (2025.01)

(58) Field of Classification Search
  CPC ........... H01L 29/66439; H01L 29/6653; H01L 29/66553; H01L 29/6656; H01L 29/66795; H01L 29/66818; H01L 29/775; H01L 29/785; H01L 29/7851; H01L 29/7853; H01L 29/7855; H01L 2029/7858
  See application file for complete search history.

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 11,315,925 B2 | 4/2022 | Huang et al. |
| 11,855,096 B2 * | 12/2023 | Huang ................. H10D 62/118 |
| 2013/0285116 A1 | 10/2013 | Lochtefeld et al. |
| 2017/0256609 A1 | 9/2017 | Bhuwalka et al. |
| 2017/0256611 A1 * | 9/2017 | Kim .................... H10D 84/038 |
| 2018/0047832 A1 * | 2/2018 | Tapily ................. H10D 30/014 |
| 2019/0067113 A1 * | 2/2019 | Chiang ................ H10D 64/251 |
| 2019/0081155 A1 * | 3/2019 | Xie ...................... H10D 30/014 |
| 2019/0221483 A1 | 7/2019 | Mulfinger et al. |
| 2021/0066294 A1 | 3/2021 | Huang et al. |
| 2022/0246614 A1 | 8/2022 | Huang et al. |

* cited by examiner

300

```
┌─────────────────────────────────────────────────────────────┐
│ Depositing alternating layers of a first semiconductor      │
│ material and a second semiconductor material on a substrate,│
│ the first semiconductor material being a sacrificial        │──302
│ material and the second semiconductor material comprising   │
│ a channel material, wherein each layer of the first         │
│ semiconductor material varies in characteristics            │
└─────────────────────────────────────────────────────────────┘
                              ↓
┌─────────────────────────────────────────────────────────────┐
│ Performing a patterning process to form a fin stack         │──304
└─────────────────────────────────────────────────────────────┘
                              ↓
┌─────────────────────────────────────────────────────────────┐
│ Partially laterally etching the first semiconductor material│
│ from the fin stack such that a width of remaining portions  │──306
│ of the first semiconductor material is substantially uniform│
└─────────────────────────────────────────────────────────────┘
                              ↓
┌─────────────────────────────────────────────────────────────┐
│ Forming side spacers on each of the remaining portions of   │
│ the first semiconductor material such that a width of       │──308
│ sidewall spacers increases towards the substrate            │
└─────────────────────────────────────────────────────────────┘
```

FIG. 3

UNIFORM GATE WIDTH FOR NANOSTRUCTURE DEVICES

PRIORITY INFORMATION

The present application is a continuation application of U.S. patent application Ser. No. 17/728,247, filed Apr. 25, 2022, which is a continuation application of U.S. patent application Ser. No. 16/932,476, filed Jul. 17, 2020, which claims the benefit of U.S. Provisional Application No. 62/892,661 filed Aug. 28, 2019 and U.S. Provisional Application No. 62/894,325 filed Aug. 30, 2019, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flowchart showing an illustrative method for forming a nanostructure device with uniform gate thickness, according to one example of principles described herein.

DETAILED DESCRIPTION

Figure 1A:
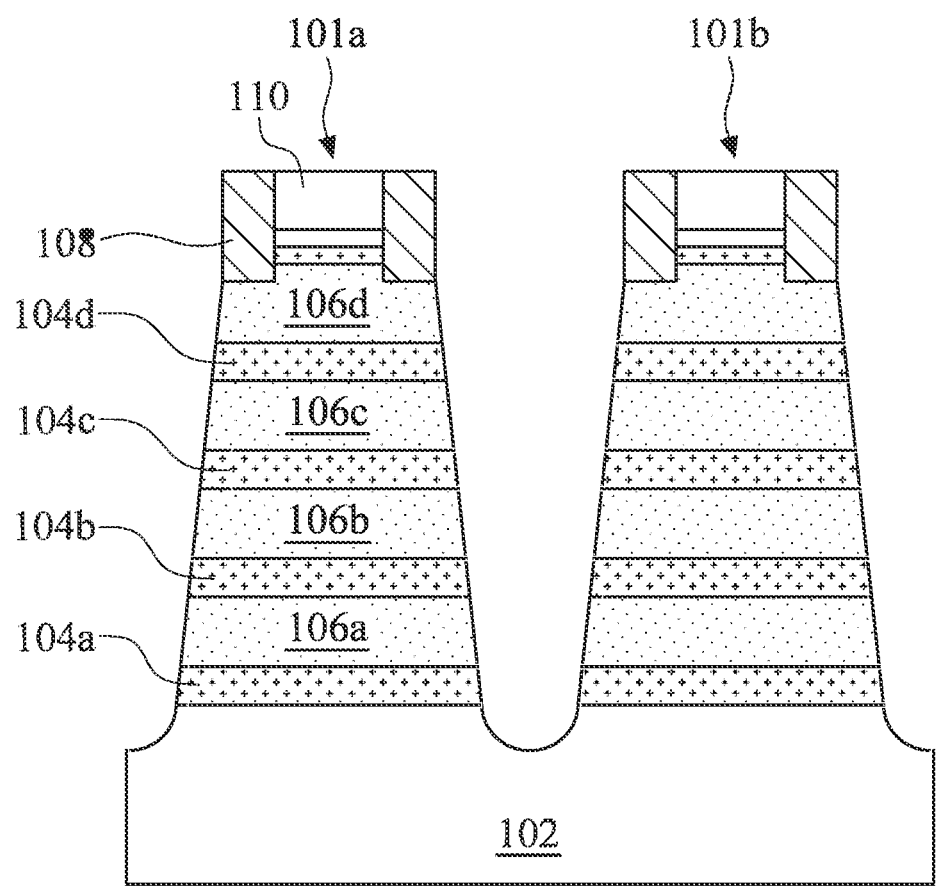
FIGS. 1A, 1B, 1C, 1D, 1E, and 1F are diagrams showing an illustrative process for achieving more uniform gate width in nanostructure devices, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

In some example embodiments, to form a GAA device, a semiconductor fin may include a total of three to ten alternating layers of semiconductor materials; of course, the present disclosure is not limited to such configuration. In the present disclosure, the first semiconductor material includes Si, while the second semiconductor material includes SiGe. Either of the semiconductor materials and (or both) may be doped with a suitable dopant, such as a p-type dopant or an n-type dopant, for forming desired FETs. The semiconductor materials and may each be formed by an epitaxial process, such as, for example, a molecular beam epitaxy (MBE) process, a CVD process, and/or other suitable epitaxial growth processes.

In many embodiments, alternating layers of the semiconductor materials are configured to provide nanowire or nanosheet devices such as GAA FETs, the details of forming which are provided below. GAA FETs have been introduced in effort to improve gate control by increasing gate-channel coupling, reduce OFF-state current, and reduce short-channel effects. A multi-gate device such as a GAA FET generally includes a gate structure that extends around its channel region (horizontal or vertical), providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs.

In a GAA device, a channel stack is formed by depositing alternating layers of semiconductor material that may be selectively etched. For example, a first type of semiconductor material may be epitaxially grown on a substrate. Then, a second type of semiconductor material may be epitaxially grown on that first layer. The process continues by forming alternating layers of the first and second semiconductor material. Then, the channel stacks may be patterned into fin structures. Each fin may thus be a fin stack of alternating semiconductor layers. Then, an etching process (e.g., a wet etching process) can be used to remove the second semiconductor material while leaving the first semiconductor material substantially intact. The remaining second semiconductor material may thus form a stack of nanowires or nanosheets extending between two active regions. A gate device can then be formed to completely surround each of the nanowires or nanosheets.

In conventional fabrication techniques, the patterning process to pattern the channel stack into fin stacks results in fin shapes that are wider at the bottom than they are the top. Thus, when the gate device is ultimately formed, it is wider at the bottom than it is at the top. This may result in a gate device that does not perform as well.

To avoid this issue and produce a fin stack gate device that has a uniform gate width surrounding each of the nanostructure, various techniques are described. Specifically, each layer of the alternating semiconductor material layers may vary in characteristics that affect etch rate. For example, in the case where the channel stack alternates between silicon and silicon germanium, the concentration of germanium may be higher in lower layers than it is in higher layers. Thus, after the patterning process forms the fin stacks, the silicon germanium can be partially laterally etched. Because the lower layers have a higher concentration of germanium, they will be etched away at a higher rate than are higher layers. This compensates for the size discrepancy in the silicon germanium layers of the fin stacks. The etched away portions can then be filled with a dielectric material. After the gate is formed, it will be more uniform in width, and the inner spacers will be wider at lower levels than they are at higher levels.

In one example, the characteristics of the fin stack may vary in that lower layers of the sacrificial semiconductor material are thicker than higher layers. Thus, the lower layers will be removed at a quicker rate than the higher levels during the lateral etching process. Again, after the gate is formed, it will be more uniform in width, and the gate spacers will be wider at lower levels than they are at higher levels. The more uniform gate width may still have a small amount of variation. For example, the variation may be between a maximum and a minimum within 5%. And 5% is critical because if out of this range the device characteristic such as threshold voltage may be more unstable, thus impacting the performance.

FIGS. 1A, 1B, 1C, 1D, 1E, and 1F are diagrams showing an illustrative process for achieving more uniform gate width in nanostructure fin stacks by using different semiconductor concentration levels at different layers of the sacrificial material. FIG. 1A is a diagram showing a cross-sectional view of an illustrative workpiece. The workpiece includes a semiconductor substrate 102. The semiconductor substrate 102 may be a silicon substrate. The semiconductor substrate may be part of a silicon wafer. Other semiconductor materials are contemplated. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

FIG. 1A illustrates two separate fin stacks 101a, 101b. To form these fin stacks, alternating semiconductor layers are deposited onto the substrate 102. For example, a first type semiconductor layer 104 is deposited on the substrate 102. The first type semiconductor material is a sacrificial material that will ultimately be removed. Thus, this layer will also be referred to as the sacrificial semiconductor layer. Then, a second type semiconductor material 106 is deposited. The second type semiconductor layer will ultimately form part of the channel of a nanostructure transistor device. Thus, the second type semiconductor layer will also be referred to as a channel semiconductor layer. Formation of both the first type semiconductor material and the second type semiconductor material may be done using an epitaxial growth process. The process of forming the first type semiconductor material and the second type semiconductor material may be repeated until the desired number of layers are reached. In the present example, there are four sacrificial layers 104a, 104b, 104c, 104d and four channel layers 106a, 106b, 106c, 106d.

To vary the characteristics of the sacrificial layers 104, and thus affect the etch rate of such layers, lower layers have a thicker doping concentration than upper layers. For example, in the case where the sacrificial semiconductor layers comprise silicon germanium and the channel layers 104 comprise silicon, then the germanium concentration may vary per layer 104. Specifically, in the present example, layer 104a has a greater germanium concentration than layer 104b. Layer 104b has a greater germanium concentration than layer 204c. Layer has a greater germanium concentration than layer 104d. A higher germanium concentration allows a wet etching process to etch at a faster rate. In one example, the bottom layer 104a may have a germanium concentration within a range of about 30-50 percent and the top layer 104d may have a germanium concentration within a range of about 5-20 percent. The middle layers 104b, 104c may have a range between 5-50 percent germanium concentration. The germanium concentration is tuned so as to control the etch rate, as will be described in further detail below.

After the desired number of semiconductor layers 104, 106 has been achieved, the fin stack may be formed. In one example, a patterning process is applied to form the fin stacks 101a, 101b. The patterning process may include a photolithographic process. For example, a hard mask layer and a photoresist layer may be deposited upon the workpiece. The hardmask layer 118 may include at least one of silicon oxide (SiO2), silicon nitride (SiN), silicon carbide (SiC), silicon oxynitride (SiON), silicon oxycarbide (SiOCN), hafnium oxide (HfO2), aluminum oxide (Al2O3), and zirconium oxide (ZrO2).

Then, the photoresist layer may be exposed to a light source through a photomask. The photomask may then be developed. Then, an etching process may be applied to transfer the pattern in the photoresist to the hard mask layer. After this process, the hard mask exposes portions of the alternating set of layers 104, 106. Then, a directional etching process such as a dry etching process is used to pattern the semiconductor layers 104, 106. Due to the characteristics of this etching process, the sidewalls of the fin stacks 101a, 101b are not perfectly perpendicular to the plane of the substrate 102. Rather, the fin stacks 101a, 101b have a conical or tapered shape to them, as shown in FIG. 1A.

On top of the fin stacks 101a, 101b are dummy gate devices 110. The dummy gate devices 110 may include sidewall spacers 108. In one example, the dummy gate devices 110 may include polysilicon.

Figure 1B:
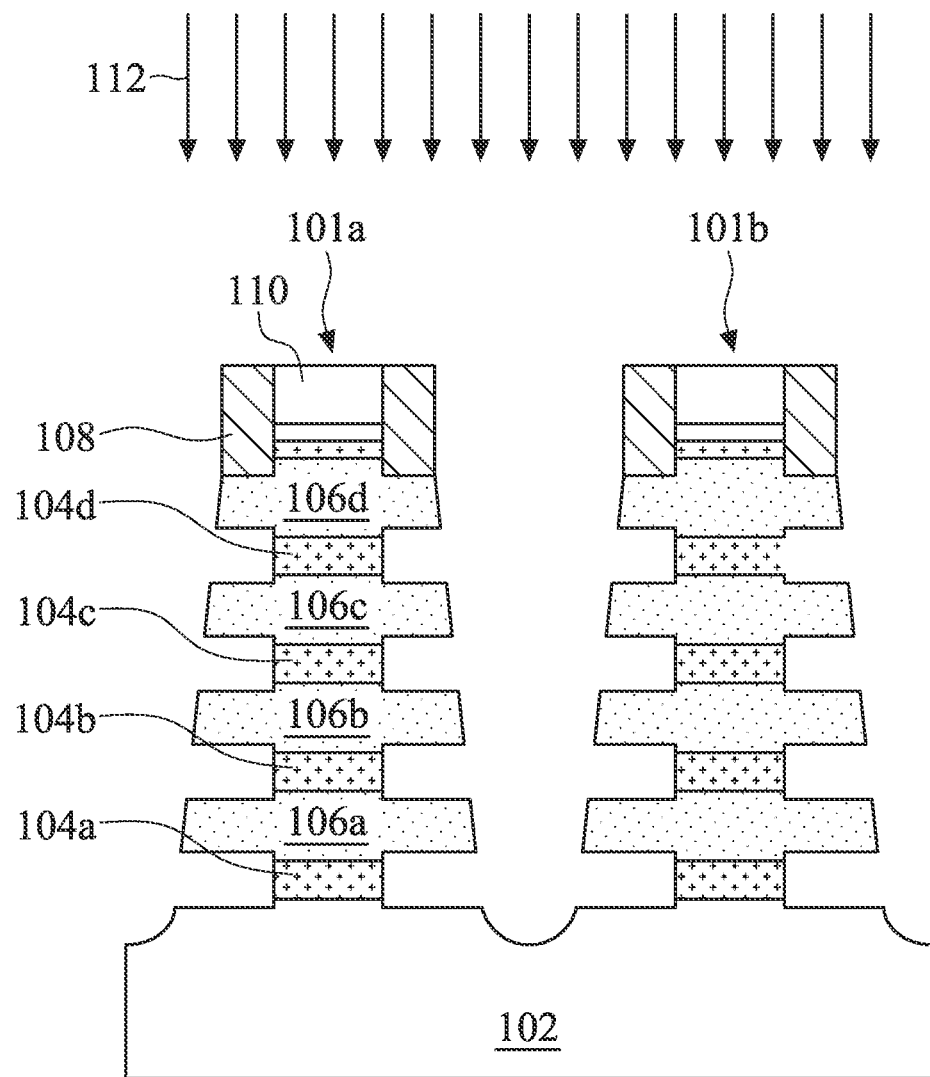

FIG. 1B illustrates a lateral etching process 112 to partially remove the sacrificial semiconductor layers 104. In the present example, because the lower layers have a greater concentration of germanium, the etching process 112 removes such layers at a higher rate. Thus, without principles described herein the remaining portions of the sacrificial semiconductor layers 104 would be wider for the bottom layers than the upper layers. However, because the characteristics of the sacrificial semiconductor layers 104 are varied (different doping concentrations), each of the remaining layers has a substantially similar width.

Figure 1C:
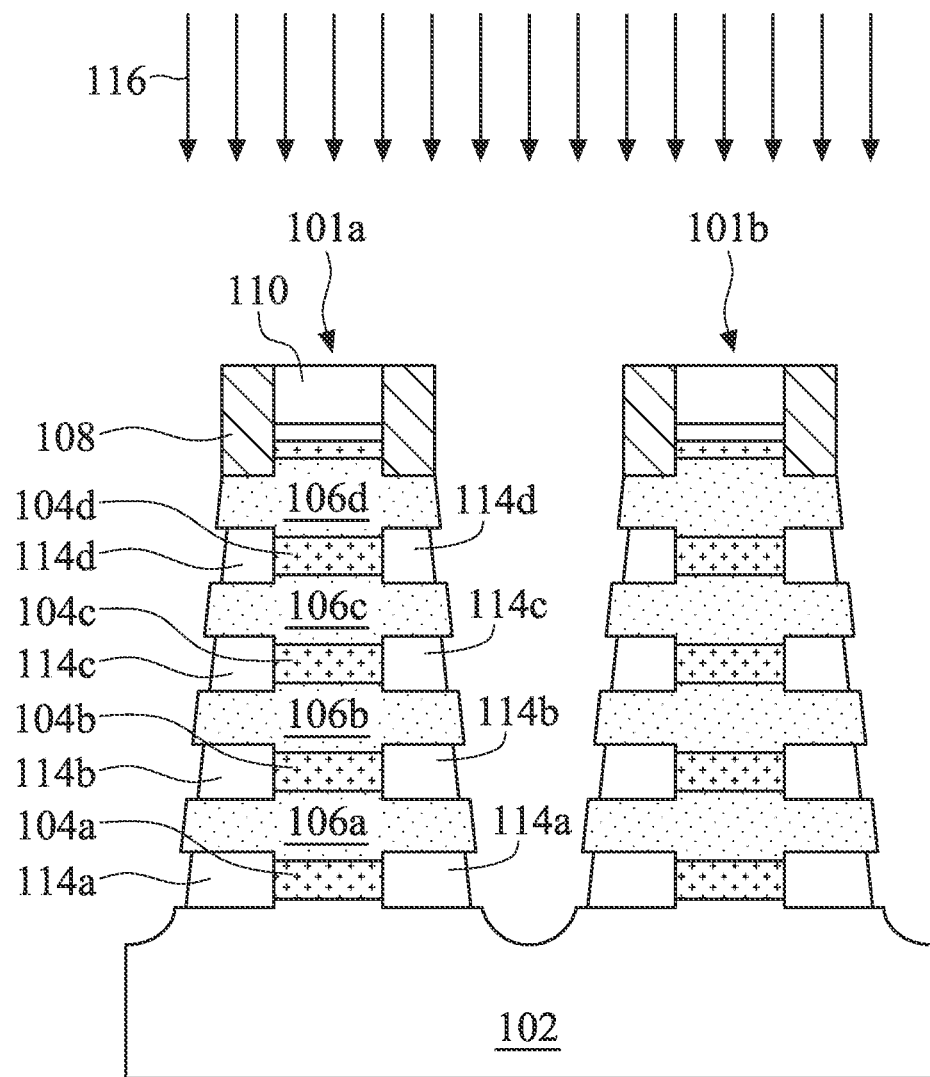

FIG. 1C illustrates a deposition process 116 the forms inner spacers 114 along each of the remaining portions of the sacrificial semiconductor layers. Specifically, inner spacers 114a are formed on the sides of layer 104a, inner spacers 114b are formed on the sides of layer 104b, inner spacers 114c are formed on the sides of layer 104c, and inner spacers 114d are formed on the sides of layer 104d. In the present example, the inner spacers 114a are wider than inner spacers 114b, the inner spacers 114b are wider than the inner spacers 114c, and the inner spacers 114c are wider than the inner spacers 114d. In some examples, the inner spacers 114 are formed by depositing a dielectric material over the workpiece. The dielectric material may just be conformally deposited over the fin stacks 101a, 101b and fill the space left by partially removing the sacrificial semiconductor layers. Then, an etch back process may be applied to remove the dielectric material so as to expose the channel layers 106. In some examples, the sidewall spacers may vary within a range of width between about 4-15 nanometers. This range is ideal for device performance. Variation outside this range may reduce device performance.

When using principles described herein to form the inner spacers 114, different layers will have different widths. Specifically, lower layers will have wider sidewall structures than upper layers. In the present example, inner spacers 114a are wider than inner spacers 114b. Similarly, inner spacers 114b are wider than inner spacers 114c. Inner spacers 114c are wider than inner spacers 114d. In some examples, the inner spacers 114 may include one of: SiCN, SiOCN, and SiON.

Figure 1D:
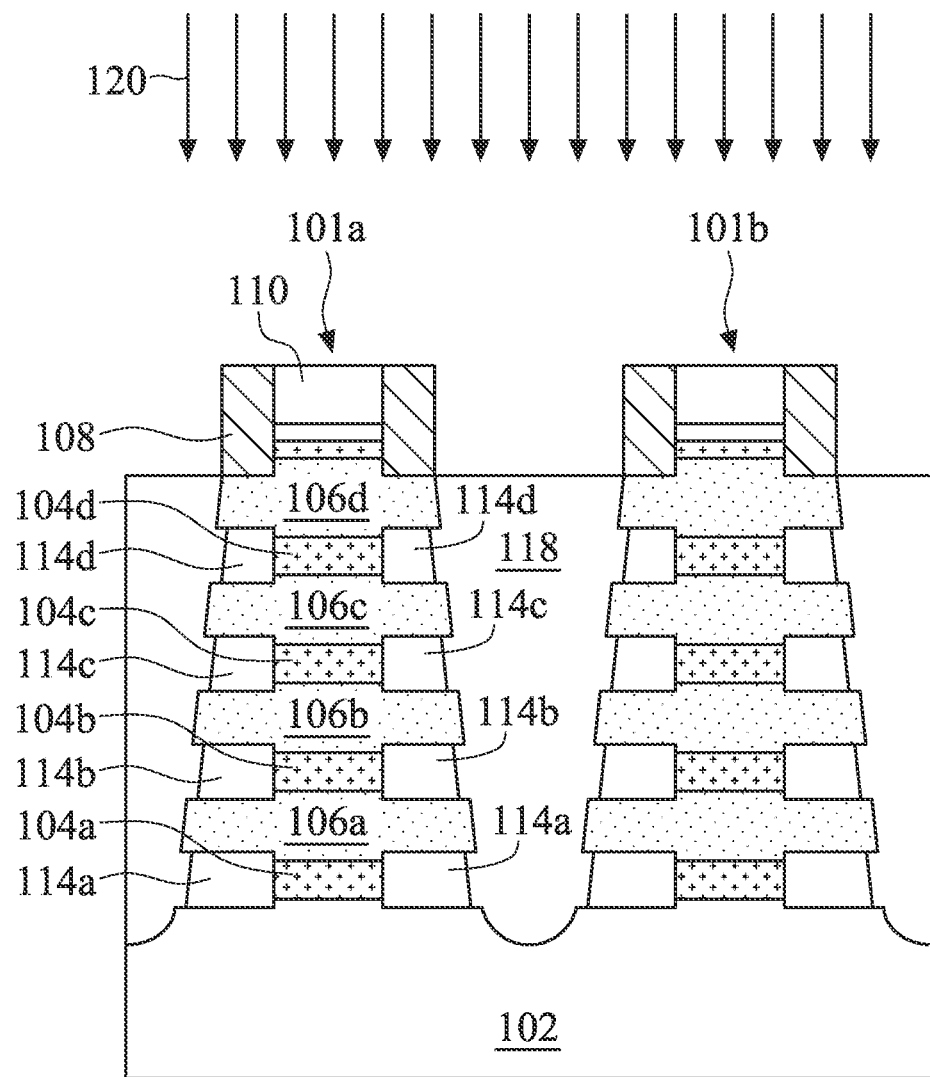

FIG. 1D illustrates a process 120 for forming source and drain regions 118. In some examples, the source and drain regions are created by performing an epitaxial growth process. An epitaxial growth process involves forming a crystal structure on a crystal substrate. In the present example, the source and drain regions 118 are grown from the substrate 102 and channel regions 106. In some examples, the source and drain regions 118 may be doped in situ so as to obtain the desired properties.

Figure 1E:
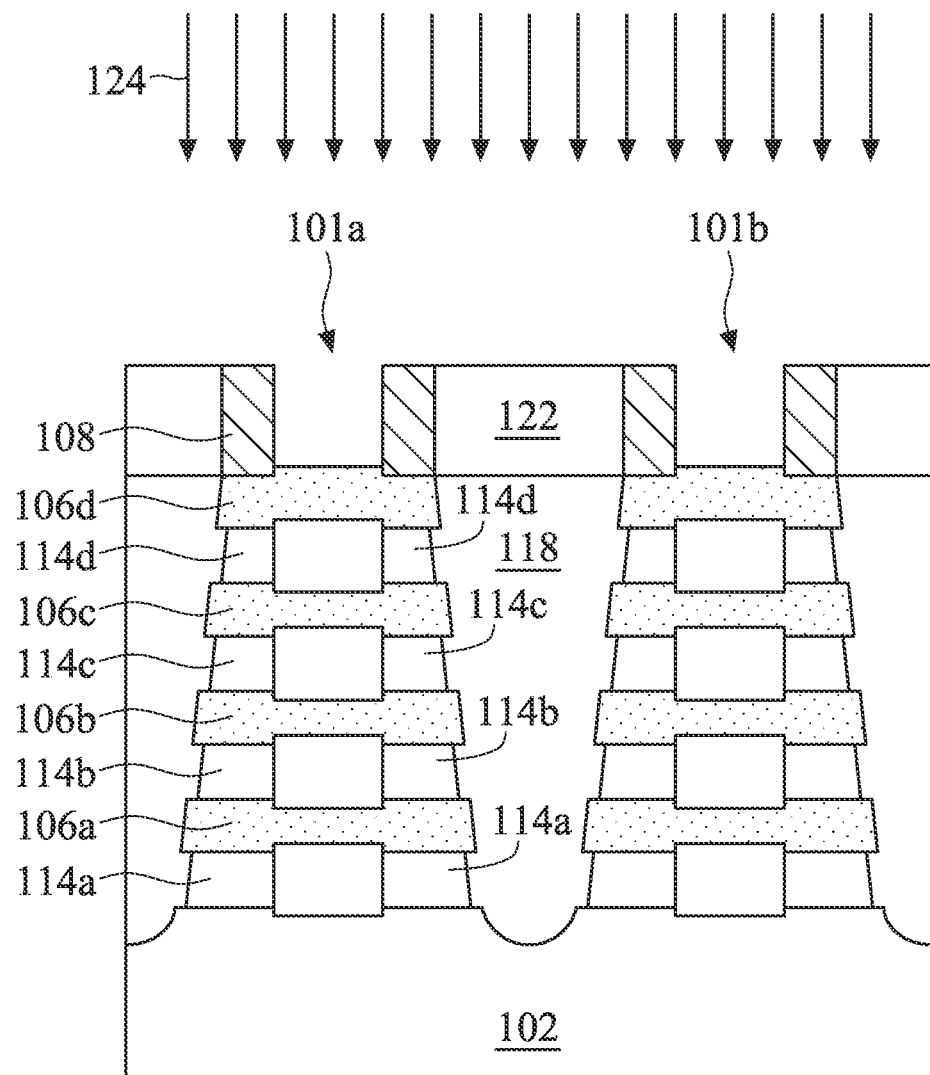

FIG. 1E illustrates a process 124 by which the sacrificial semiconductor layers 104 are removed. Additionally, the process 124 involves removing the dummy gate layers 110. In some examples, before such features are removed, an interlayer dielectric (ILD) is deposited on top of the source and drain regions 118 and between the sidewall structures 108 of the dummy gates 110. The removal process 124 may be, for example a wet etching process. The wet etching process may be selective so as to remove the sacrificial semiconductor layers 104 leaving the channel layers 106 substantially intact. The wet etching process may use an acid-based etchant such as: sulfuric acid (H2SO4), perchloric acid (HClO4), hydroiodic acid (HI), hydrobromic acid (HBr), nitric acide (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH). By removing the sacrificial semiconductor layers 104, the channel layers 106 thus become nanostructures extending between source and drain regions 118.

Figure 1F:
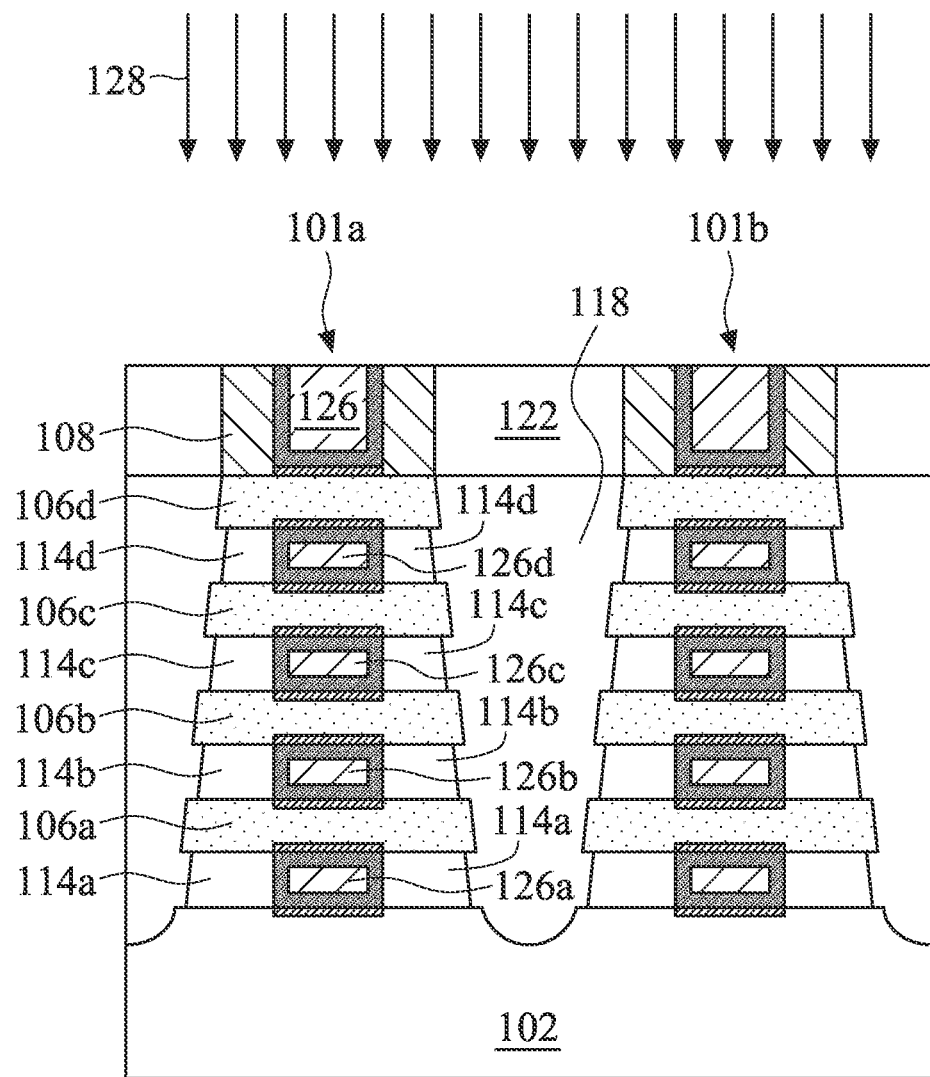

FIG. 1F illustrates a process for forming a real gate device. Formation of the real gate device may include a number of steps. For example, a high-k dielectric layer may be deposited so as to surround the channel layers 106. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

In some examples, depending on the type of transistor device being formed, a work function layer may be deposited. Such metal is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC).

Then, a gate layer 126 is deposited. The gate layer 126 may be a conductive material such as a metal material. In this manner, the gate layer 126 entirely surrounds each of the channel layers 106. For purposes of discussion the portions of the gate layer between the channels will be referred to as gate regions 126a, 126b, 126c, 126d. Each of the gate regions 126a, 126b, 126c, 126d is substantially similar in width. Without applying the principles described herein, the gate regions would have different widths. However, with the more uniform width, device performance is improved.

Figure 2A:
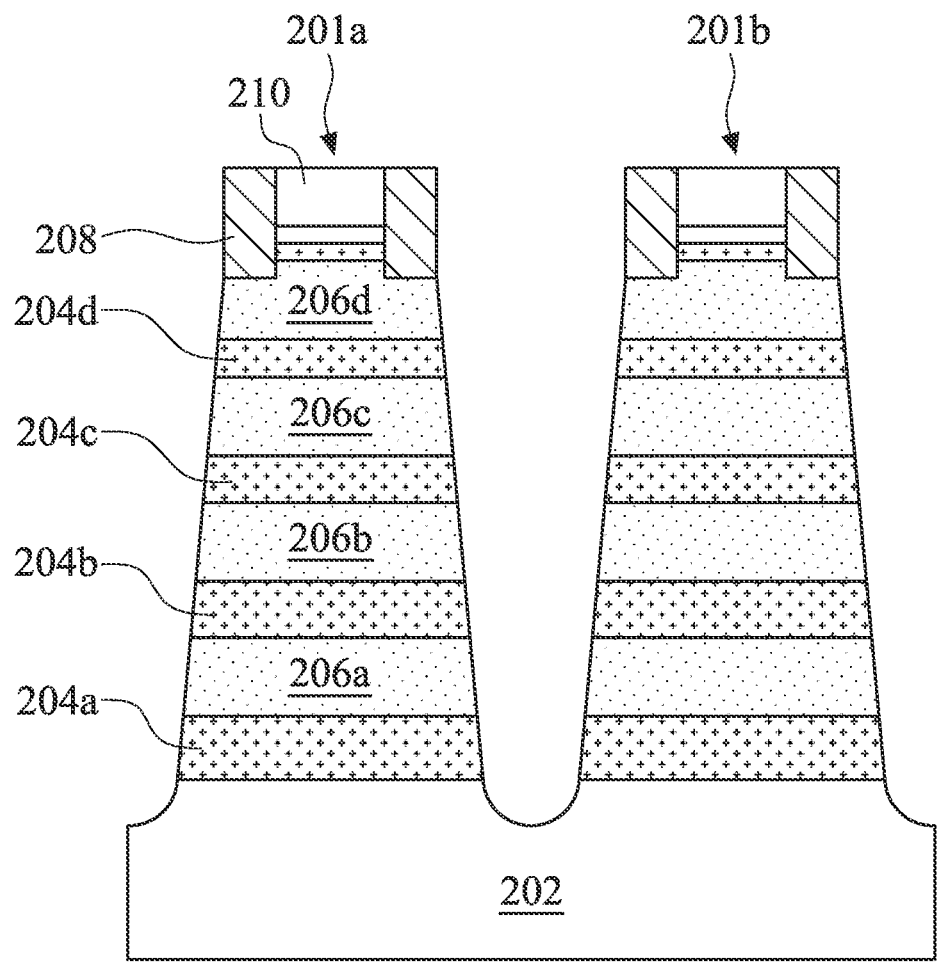
FIGS. 2A, 2B, 2C, 2D, 2E, and 2F are diagrams showing an illustrative process for achieving more uniform gate width in nanostructure devices, according to one example of principles described herein.

FIGS. 2A, 2B, 2C, 2D, 2E, and 2F are diagrams showing an illustrative process for achieving more uniform gate width in nanostructure fin stacks by using varied thickness of the sacrificial material layers. FIG. 2A is a diagram showing a cross-sectional view of an illustrative workpiece. The workpiece includes a semiconductor substrate 202. The semiconductor substrate 202 may be a silicon substrate. The semiconductor substrate may be part of a silicon wafer. Other semiconductor materials are contemplated. The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

FIG. 2A illustrates two separate fin stacks 201a, 201b. To form these fin stacks, alternating semiconductor layers are deposited onto the substrate 202. For example, a first type semiconductor layer 204 is deposited on the substrate 202. The first type semiconductor material is a sacrificial material that will ultimately be removed. Thus, this layer will also be referred to as the sacrificial semiconductor layer. Then, a second type semiconductor material 206 is deposited. The second type semiconductor layer will ultimately form part of the channel of a nanostructure transistor device. Thus, the second type semiconductor layer will also be referred to as a channel semiconductor layer. Formation of both the first type semiconductor material and the second type semiconductor material may be done using an epitaxial growth process. The process of forming the first type semiconductor material and the second type semiconductor material may be repeated until the desired number of layers are reached. In the present example, there are four sacrificial layers 204a, 204b, 204c, 204d and four channel layers 206a, 206b, 206c, 206d.

To vary the characteristics of the sacrificial layers 204, and thus affect the etch rate of such layers, lower layers are thicker than upper layers. Specifically, in the present example, layer 204a is thicker than layer 204b. Layer 204b is thicker than layer 204c. Layer 204c is thicker than layer 204d. A thicker layer exposes more surface area to a wet etching process and thus etches at a faster rate. The thickness of a layer may also be referred to as the depth of the layer. In some examples, the depth or thickness of a layer may vary from other layers within a range of about 2-12 nanometers. The depth or thickness may be tuned so as to control the etch rate.

After the desired number of semiconductor layers 204, 206 has been achieved, the fin stack may be formed. In one example, a patterning process is applied to form the fin stacks 201a, 201b. The patterning process may include a photolithographic process. For example, a hard mask layer and a photoresist layer may be deposited upon the workpiece. The hardmask layer may include at least one of silicon oxide (SiO2), silicon nitride (SiN), silicon carbide (SiC), silicon oxynitride (SiON), silicon oxycarbide (SiOCN), hafnium oxide (HfO2), aluminum oxide (Al2O3), and zirconium oxide (ZrO2).

Then, the photoresist layer may be exposed to a light source through a photomask. The photomask may then be developed. Then, an etching process may be applied to transfer the pattern in the photoresist to the hard mask layer. After this process, the hard mask exposes portions of the alternating set of layers 204, 206. Then, a directional etching process such as a dry etching process is used to pattern the semiconductor layers 204, 206. Due to the characteristics of this etching process, the sidewalls of the fin stacks 201a, 201b are not perfectly perpendicular to the plane of the substrate 202. Rather, the fin stacks 201a, 201b have a conical or tapered shape to them, as shown in FIG. 2A.

On top of the fin stacks 201a, 201b are dummy gate devices 210. The dummy gate devices 210 may include sidewall spacers 208. In one example, the dummy gate devices 210 may include polysilicon.

Figure 2B:
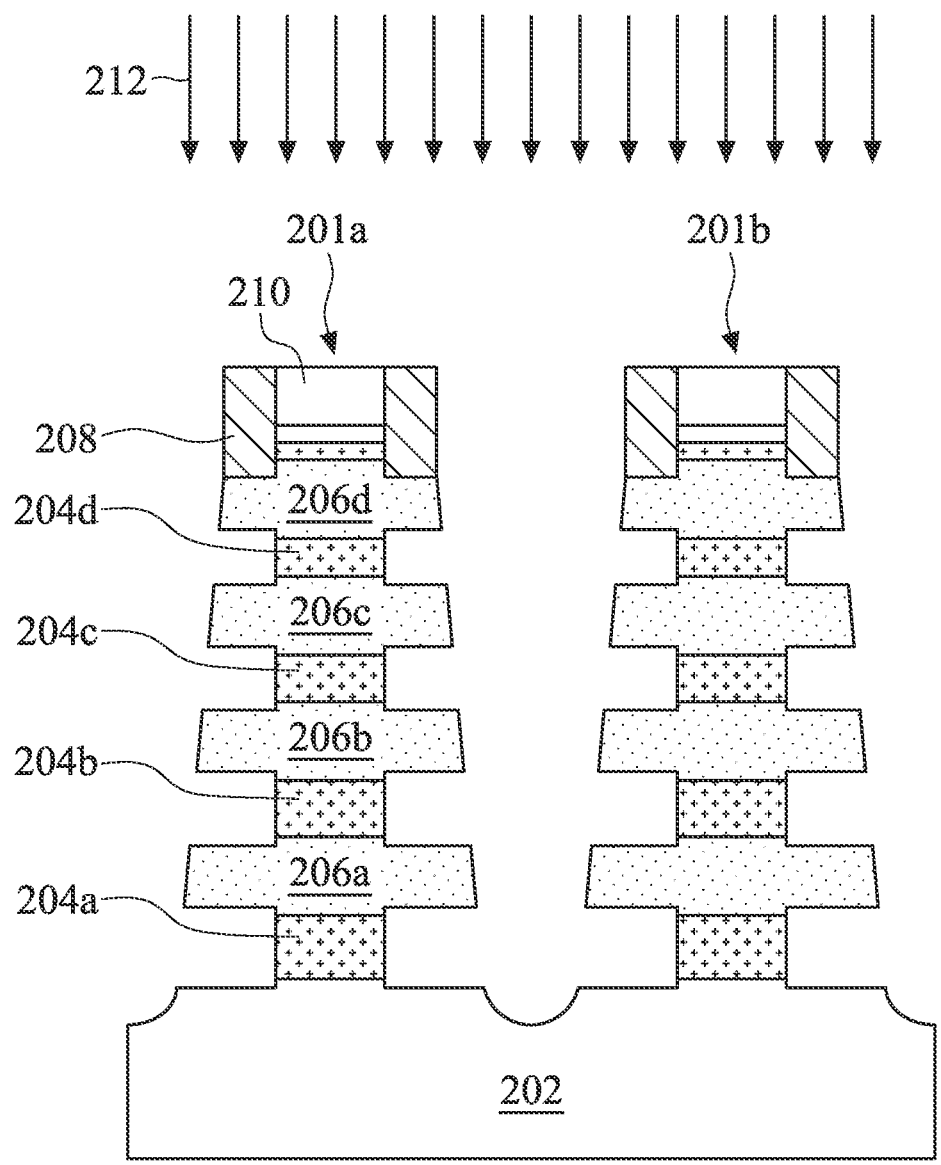

FIG. 2B illustrates a lateral etching process 212 to partially remove the sacrificial semiconductor layers 204. In the present example, because the lower layers are thicker, more surface area is exposed and the etching process 212 removes such layers at a higher rate. Thus, without principles described herein the remaining portions of the sacrificial semiconductor layers 204 would be wider for the bottom layers than the upper layers. However, because the characteristics of the sacrificial semiconductor layers 204 are varied (different thicknesses), each of the remaining layers has a substantially similar width.

Figure 2C:
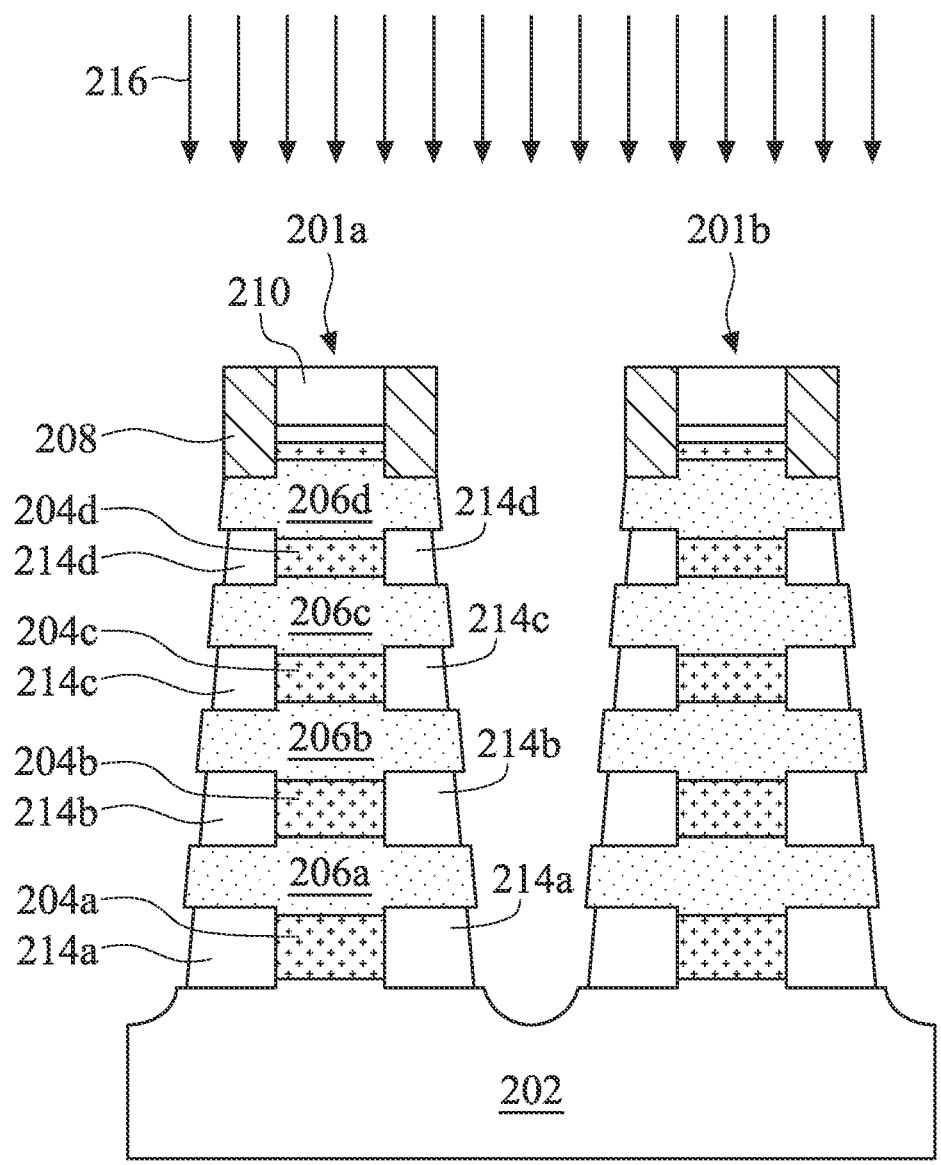

FIG. 2C illustrates a deposition process 216 the forms sidewall structures 214 along each of the remaining portions of the sacrificial semiconductor layers. Specifically, inner spacers 214a are formed on the sides of layer 204a, inner spacers 214b are formed on the sides of layer 204b, inner spacers 214c are formed on the sides of layer 204c, and inner spacers 214d are formed on the sides of layer 204d. In the present example, the inner spacers 214a are wider than inner spacers 214b, the inner spacers 214b are wider than the inner spacers 214c, and the inner spacers 214c are wider than the inner spacers 214d. In some examples, the inner spacers 214 are formed by depositing a dielectric material over the workpiece. The dielectric material may just be conformally deposited over the fin stacks 201a, 210b and fill the space left by partially removing the sacrificial semiconductor layers. Then, an etch back process may be applied to remove the dielectric material so as to expose the channel layers 206. In some examples, the inner spacers 214 may include one of: SiCN, SiOCN, and SiON.

When using principles described herein to form the inner spacers 214, different layers will have different widths. Specifically, lower layers will have wider inner spacers than upper layers. In the present example, inner spacers 214a are wider than inner spacers 214b. Similarly, inner spacers 214b are wider than inner spacers 214c. Inner spacers 214c are wider than inner spacers 214d.

Figure 2D:
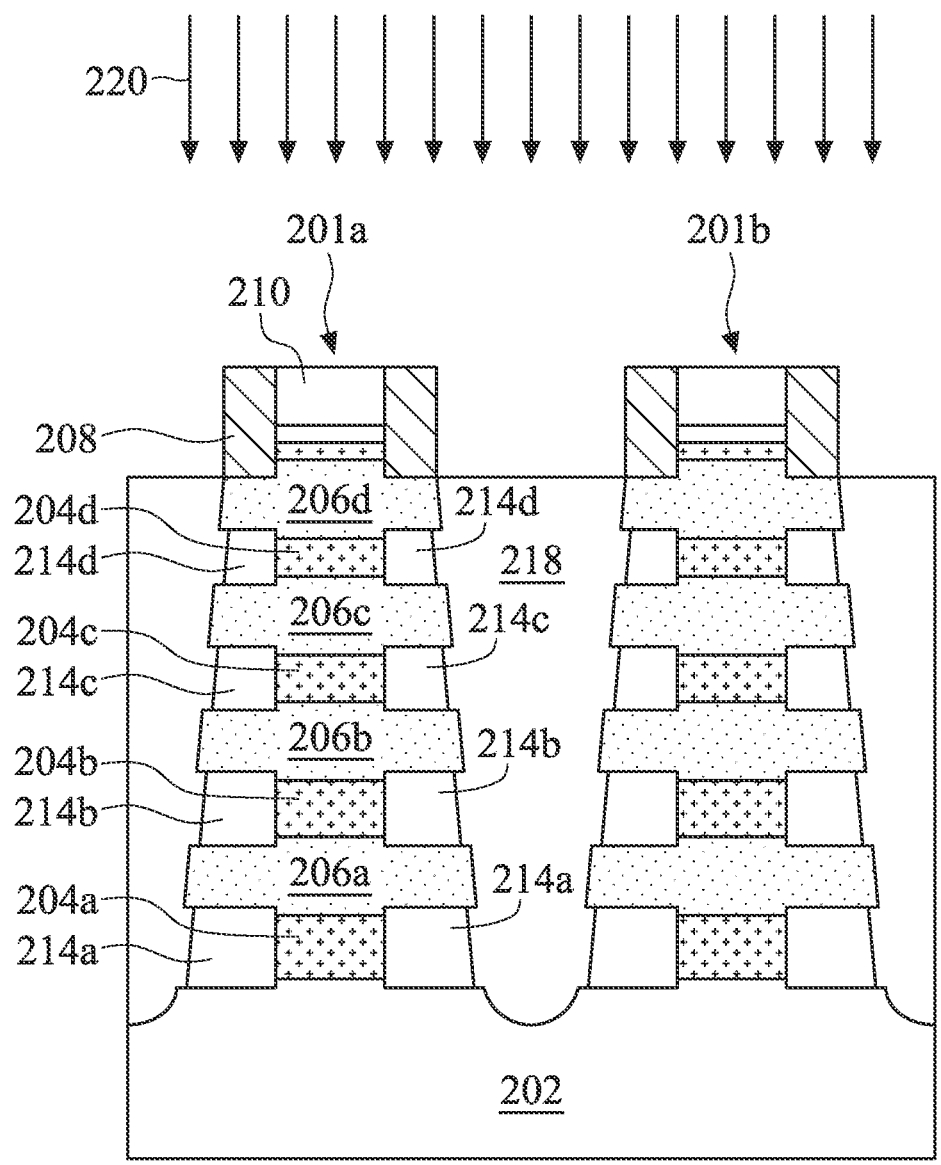

FIG. 2D illustrates a process 220 for forming source and drain regions 218. In some examples, the source and drain regions are created by performing an epitaxial growth process. An epitaxial growth process involves forming a crystal structure on a crystal substrate. In the present example, the source and drain regions 218 are grown from the substrate 202 and channel regions 206. In some examples, the source and drain regions 218 may be doped in situ so as to obtain the desired properties.

Figure 2E:
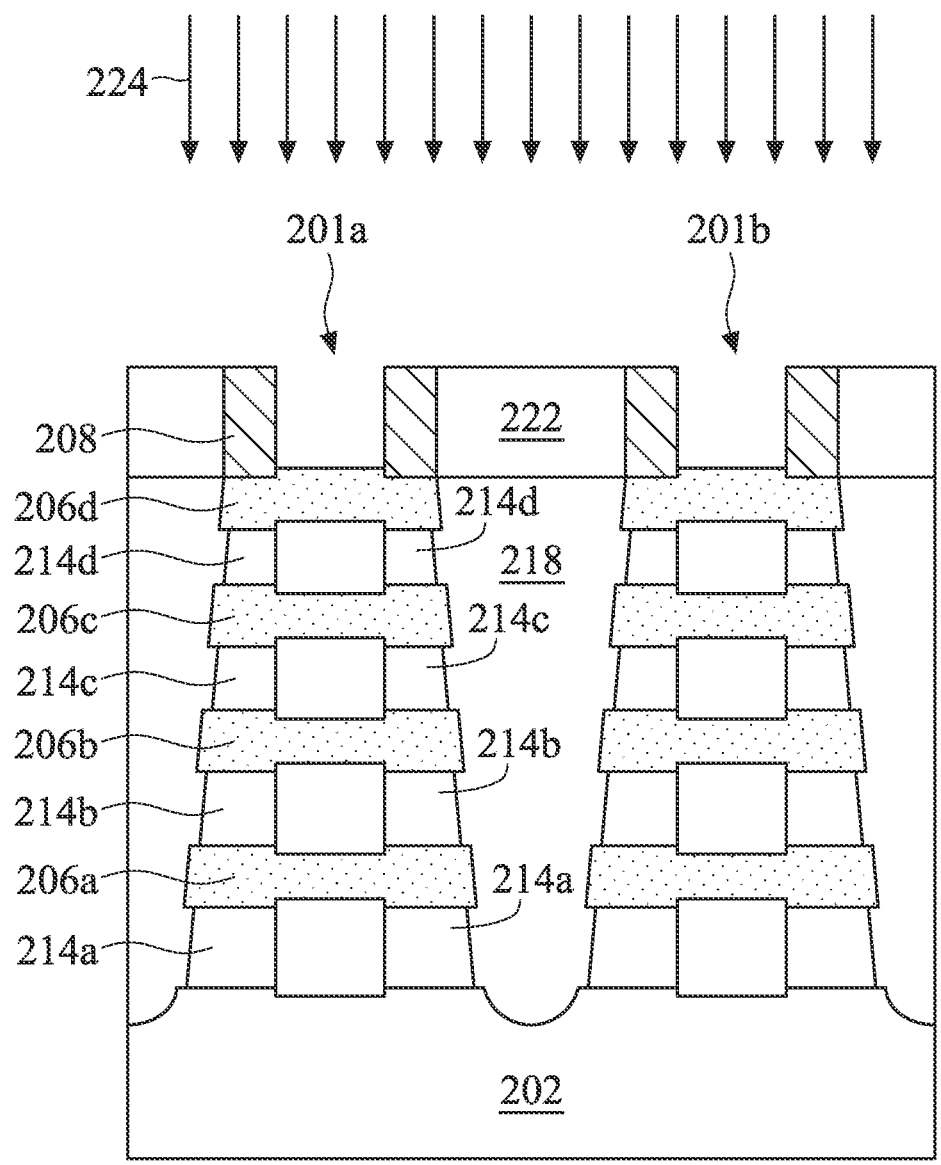

FIG. 2E illustrates a process 224 by which the sacrificial semiconductor layers 204 are removed. Additionally, the process 224 involves removing the dummy gate layers 210. In some examples, before such features are removed, an interlayer dielectric (ILD) is deposited on top of the source and drain regions 218 and between the sidewall structures 208 of the dummy gates 210. The removal process 224 may be, for example a wet etching process. The wet etching process may be selective so as to remove the sacrificial semiconductor layers 204 leaving the channel layers 206 substantially intact. The wet etching process may use an acid-based etchant such as: sulfuric acid (H2SO4), perchloric acid (HClO4), hydroiodic acid (HI), hydrobromic acid (HBr), nitric acide (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH). By removing the sacrificial semiconductor layers 204, the channel layers 206 thus become nanostructures extending between source and drain regions 218.

Figure 2F:
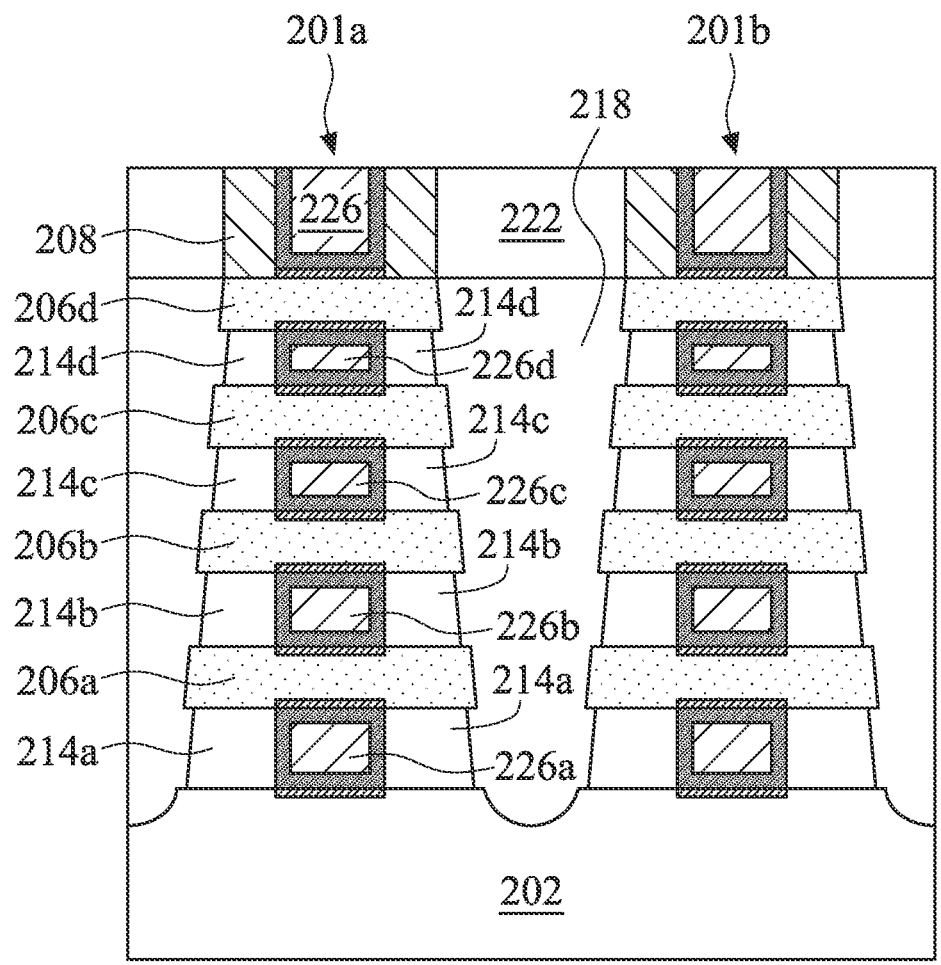

FIG. 2F illustrates a process for forming a real gate device. Formation of the real gate device may include a number of steps. For example, a high-k dielectric layer may be deposited so as to surround the channel layers 206. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

In some examples, depending on the type of transistor device being formed, a work function layer may be deposited. Such metal is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC).

Then, a gate layer 226 is deposited. The gate layer 226 may be a conductive material such as a metal material. In this manner, the gate layer 226 entirely surrounds each of the channel layers 206. For purposes of discussion the portions of the gate layer between the channels will be referred to as gate regions 226a, 226b, 226c, 226d. Each of the gate regions 226a, 226b, 226c, 226d is substantially similar in width. Without applying the principles described herein, the gate regions would have different widths. However, with the more uniform width, device performance is improved.

FIG. 3 is a flowchart showing a method for forming a nanostructure device with uniform gate width. According to the present example, the method 300 includes a process 302 for depositing alternating layers of a first semiconductor material (e.g., 104, 204) and a second semiconductor material (e.g., 106, 206) on a substrate, the first semiconductor material being a sacrificial material and the second semiconductor material comprising a channel material, wherein each layer of the first semiconductor material varies in characteristics. Specifically, each of the sacrificial semiconductor layers may vary in characteristics that affect etch rate. In particular, the characteristics vary so that lower levels will etch away more quickly than upper layers. There may be a gradation from the lower levels to the upper levels. In one example, the characteristics vary in that lower layers have a higher doping concentration than other levels. In some examples, the characteristics vary in that lower layers have a greater thickness than higher layers.

According to the present example, the method 300 further includes a process 304 for performing a patterning process to form a fin stack (or a plurality of fin stacks). The patterning process may include a photolithographic process. For example, a hard mask layer and a photoresist layer may be deposited upon the workpiece. Then, the photoresist layer may be exposed to a light source through a photomask. The photomask may then be developed. Then, an etching process may be applied to transfer the pattern in the photoresist to the hard mask layer. After this process, the hard mask exposes portions of the alternating set of layers Then, a directional etching process such as a dry etching process is used to pattern the semiconductor layers. Due to the characteristics of this etching process, the sidewalls of the fin stacks are not perfectly perpendicular to the plane of the substrate. Rather, the fin stacks have a conical or tapered shape.

According to the present example, the method 300 includes a process 306 for partially laterally etching the first semiconductor material from the fin stack such that a width of remaining portions of the first semiconductor material is substantially uniform. For example, because the lower layers have a greater concentration of germanium, or a greater thickness, the etching process removes such layers at a higher rate. Thus, without principles described herein the remaining portions of the sacrificial semiconductor layers would be wider for the bottom layers than the upper layers. However, because the characteristics of the sacrificial semiconductor layers are varied, each of the remaining layers has a substantially similar width.

According to the present example, the method 300 includes a process 308 for forming side spacers on each of the remaining portions of the first semiconductor material such that a width of sidewall spacers increases towards the substrate. In some examples, the sidewall structures are formed by depositing a dielectric material over the workpiece. The dielectric material may just be conformally deposited over the fin stacks and fill the space left by partially removing the sacrificial semiconductor layers. Then, an etch back process may be applied to remove the dielectric material so as to expose the channel layers.

According to one example, a semiconductor device includes a substrate and a fin stack that includes a plurality of nanostructures, a gate device surrounding each of the nanostructures, and inner spacers along the gate device and between the nanostructures. A width of the inner spacers differs between different layers of the fin stack.

According to one example, a semiconductor device includes a substrate and a transistor device that includes two source/drain regions, a fin stack having a plurality of channel features extending between the two source/drain regions, a gate feature surrounding the plurality of channel features so as to include a plurality of gate regions between each of the channel features, and sidewall spacers along sidewalls of the gate feature and between the channel features. A width of the sidewall spacers differs between different layers of the fin stack. A width of each of the gate regions between the channel features is substantially uniform.

A method for fabricating a semiconductor device includes depositing alternating layers of a first semiconductor material and a second semiconductor material on a substrate, the first semiconductor material being a sacrificial material and the second semiconductor material comprising a channel material, wherein each layer of the first semiconductor material varies in characteristics. The method further includes performing a patterning process to form a fin stack, partially laterally etching the first semiconductor material from the fin stack such that a width of remaining portions of the first semiconductor material is substantially uniform, and forming inner spacers on each of the remaining portions of the first semiconductor material such that a width of sidewall spacers increases towards the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a plurality of semiconductor layers disposed on a substrate, wherein the plurality of semiconductor layers includes a first semiconductor layer, a second semiconductor layer and a third semiconductor layer;
a gate structure disposed on each of the semiconductor layers such that a thickness of the gate structure between each semiconductor layer varies, wherein the gate structure includes a first gate region between the first and second semiconductor layers and a second gate region extending between the second and third semiconductor layers, wherein a width of the first gate region is substantially the same as a width of the second gate region; and
a first sidewall spacer disposed along the first gate region and a second sidewall spacer disposed along the second gate region, the first sidewall spacer having a first width and the second sidewall spacer having a second width that is different than the first width.

2. The device of claim 1, wherein the first sidewall spacer is positioned closer to the substrate than the second sidewall spacer, and
wherein the first width of the first sidewall spacer is greater than the second width of the second sidewall spacer.

3. The device of claim 2, wherein the first sidewall spacer is thicker than the second sidewall spacer.

4. The device of claim 1, wherein the first semiconductor layer, the second semiconductor layer and the third semiconductor layer have the same material composition.

5. The device of claim 1, further comprising a source/drain feature, wherein the source/drain feature interfaces with the first semiconductor layer, the second semiconductor layer and the third semiconductor layer.

6. The device of claim 5, wherein the first sidewall spacer and the second sidewall spacer interface with the source/drain feature.

7. The device of claim 1, wherein the substrate includes a protruding portion, wherein the first semiconductor layer, the second semiconductor layer and the third semiconductor layer are disposed directly over the protruding portion of the substrate.

8. A device comprising:
a first semiconductor layer disposed over a substrate;
a second semiconductor layer disposed over the first semiconductor layer; and
a third semiconductor layer disposed over the second semiconductor layer;
a gate stack wrapping around each of the first semiconductor layer, the second semiconductor layer and the third semiconductor layer, the gate stack including a first gate region extending from the first semiconductor layer to the second semiconductor layer and a second gate region extending from the second semiconductor layer to the third semiconductor layer, wherein the first gate region has a first thickness and the second gate region has a second thickness that is less than the first thickness; and
a first sidewall spacer interfacing with the first gate region and a second sidewall spacer interfacing with the second gate region, the first sidewall spacer having a different thickness than the second sidewall spacer.

9. The device of claim 8, wherein the first sidewall spacer is thicker than the second sidewall spacer.

10. The device of claim 8, wherein a width of the first gate region is substantially the same as a width of the second gate region.

11. The device of claim 8, wherein the first gate region includes a first portion of a gate electrode layer and a first portion of a gate dielectric layer, and
wherein the second gate region includes a second portion of the gate electrode layer and a second portion of the gate dielectric layer.

12. The device of claim 11, wherein the first portion of the gate electrode layer has a substantially similar width as the second portion of the gate electrode layer.

13. The device of claim 8, further comprising a source/drain feature,
wherein the first semiconductor layer has a top surface facing a bottom surface of the second semiconductor layer, and
wherein the source/drain feature interfaces with the top surface of the first semiconductor layer and the bottom surface of the second semiconductor layer.

14. The device of claim 8, wherein the second semiconductor layer is wider than the first semiconductor layer, and
wherein the third semiconductor layer is wider than the second semiconductor layer.

15. The device of claim 14, wherein the first sidewall spacer extends from the first semiconductor layer to the second semiconductor layer, and
wherein the second sidewall spacer extends from the second semiconductor layer to the third semiconductor layer.

16. A method comprising:
forming a plurality of alternating layers of a first semiconductor layer and a second semiconductor layer over a substrate, wherein each first semiconductor layer comprises a dopant;
forming spacers between each of the second semiconductor layers such that each spacer has a different width;
removing each of the first semiconductor layers; and
forming a gate stack wrapping around each of the second semiconductor layers,
wherein a concentration of the dopant in a bottommost one of first semiconductor layers is greater than a concentration of the dopant in any of the first semiconductor layers above the bottommost one of the first semiconductor layers.

17. The method of claim 16, further comprising removing a first portion from each of the first semiconductor layers prior to the forming of the spacers between each of the second semiconductor layers.

18. The method of claim 17, wherein a second portion of each of the first semiconductor layers remains after the removing of the first portion from each of the first semiconductor layers, and
wherein each second portion of the first semiconductor layers has substantially the same width.

19. The method of claim 16, wherein the concentration of the dopant of each first semiconductor layer ranges from about 5% to about 50%.

20. The method of claim 19, wherein the dopant is germanium.

* * * * *